US006883133B1

(12) United States Patent
Gupta

(10) Patent No.: US 6,883,133 B1
(45) Date of Patent: *Apr. 19, 2005

(54) METHOD AND APPARATUS FOR CONCATENATED CHANNEL CODING WITH VARIABLE CODE RATE AND CODING GAIN IN A DATA TRANSMISSION SYSTEM

(75) Inventor: Alok Kumar Gupta, Carlsbad, CA (US)

(73) Assignee: Harington Valve LLC, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/564,377

(22) Filed: May 1, 2000

Related U.S. Application Data

(63) Continuation-in-part of application No. 09/471,295, filed on Dec. 24, 1999.

(51) Int. Cl.⁷ ............................................ H03M 13/03
(52) U.S. Cl. ...................................... 714/786; 714/755
(58) Field of Search ............................... 714/786, 755, 714/781, 784, 792, 795, 752, 746; 370/240.27, 262, 265

(56) References Cited

U.S. PATENT DOCUMENTS

| | | | | |
|---|---|---|---|---|
| 4,907,233 A | * | 3/1990 | Deutsch et al. | 714/755 |
| 5,457,704 A | * | 10/1995 | Hoeher et al. | 714/794 |

(Continued)

FOREIGN PATENT DOCUMENTS

| | | | | |
|---|---|---|---|---|
| EP | 0663775 A2 | 7/1995 | | H04N/7/24 |

OTHER PUBLICATIONS

Daniel Cygan, et al., A Concatenated Two–Stage Adaptive (CTSA) Error Control Scheme for Data Transmission in Time–Varying Channels, IEEE Transactions on Communications, vol. 43, No. 43(1995) Feb./Apr., Nos. 2/4, Pt. 11, New York, USA.

(Continued)

Primary Examiner—Christine T. Tu
(74) Attorney, Agent, or Firm—Berkeley Law & Technology Group, LLC

(57) ABSTRACT

A novel method and apparatus for efficiently coding and decoding data in a data transmission system is described. A concatenated coding scheme is presented that is easily implemented, and that provides acceptable coding performance characteristics for use in data transmission systems. The inventive concatenated channel coding technique is well suited for small or variable size packet data transmission systems. The technique may also be adapted for use in a continuous mode data transmission system. The method and apparatus reduces the complexity, cost, size and power consumption typically associated with the prior art channel coding methods and apparatuses, while still achieving acceptable coding performance. The present invention advantageously performs concatenated channel coding without the necessity of a symbol interleaver. In addition, the present invention is simple to implement and thereby consumes much less space and power that do the prior art approaches. The present invention not only eliminates the need for a symbol interleaver between the outer and inner codes, but it also enjoys a drastically reduced implementation complexity of the inner code Viterbi decoder. The preferred embodiment of the present invention comprises an inner code having short length block codes derived from short constraint length convolutional codes utilizing trellis tailbiting and a decoder comprising four four-state Viterbi decoders having a short corresponding maximum length. The inner code preferably comprises short block codes derived from four-state (i.e., constraint length 3), nonsystematic, punctured and unpunctured convolutional code. One significant advantage of the preferred embodiment of the present concatenated coding technique is that packet data transmission systems can be designed to have variable coding gains and coding rates.

32 Claims, 7 Drawing Sheets

U.S. PATENT DOCUMENTS 5,511,082 A     4/1996   How et al.
5,838,728 A * 11/1998   Alamouti et al. ............ 375/265
6,298,461 B1 * 10/2001   Tong et al. .................. 714/755
6,378,101 B1 * 4/2002   Sinha et al. ................. 714/755

OTHER PUBLICATIONS

Michael B. Pursley, et al., A Comparison of Two Methods for Erasure Generation in Frequency–Hop Communications with Partial–Band Interference and Raleigh Fading, Annual Military Communications Conference, U.S., New York, IEEE, vol. Conf. 15, Oct. 22, 1996, pp. 85–89.

C.E. Shannon, "A Mathematical Theory of Communication", Reprinted with corrections from The Bell System Technical Journal, vol. 27, pp 379–423, 623–656, Jul., Oct., 1948.

* cited by examiner

400

METHOD AND APPARATUS FOR CONCATENATED CHANNEL CODING WITH VARIABLE CODE RATE AND CODING GAIN IN A DATA TRANSMISSION SYSTEM

CROSS-REFERENCE TO RELATED APPLICATIONS

This application is a continuation-in-part of U.S. application Ser. No. 09/471,295, filed Dec. 24, 1999, entitled "Method and Apparatus for Concatenated Channel Coding in a Data Transmission System", hereby incorporated by reference herein for its teachings on communication systems. This application is related to commonly-assigned U.S. Pat. No. 6,016,311, issued Jan. 18, 2000 and entitled "An Adaptive Time Division Duplexing Method and Apparatus for Dynamic Bandwidth Allocation within a Wireless Communication System", and commonly-assigned co-pending application Ser. No. 09/316,518, filed May 21, 1999 entitled "Method and Apparatus for Allocating Bandwidth in a Wireless Communication System", both references hereby incorporated by reference herein for their teachings on communication systems.

BACKGROUND OF THE INVENTION

1. Field of the Invention

This invention relates to coding methods and apparatuses, and more particularly to a method and apparatus for concatenated channel coding with variable code rate and coding gain in a data communication system.

2. Description of Related Art

As described in the commonly assigned and incorporated U.S. Pat. No. 6,016,311, a wireless communication system facilitates two-way communication between a plurality of subscriber radio stations or subscriber units (fixed and portable) and a fixed network infrastructure. Exemplary communication systems include mobile cellular telephone systems, personal communication systems (PCS), and cordless telephones. The key objective of these wireless communication systems is to provide communication channels on demand between the plurality of subscriber units and their respective base stations in order to connect a subscriber unit user with the fixed network infrastructure (usually a wire-line system). In the wireless systems having multiple access schemes a time "frame" is used as the basic information transmission unit. Each frame is sub-divided into a plurality of time slots. Some time slots are used for control purposes and some for information transfer. Subscriber units typically communicate with a selected base station using a "duplexing" scheme thus allowing for the exchange of information in both directions of connection.

Transmissions from the base station to the subscriber unit are commonly referred to as "downlink" transmissions. Transmissions from the subscriber unit to the base station are commonly referred to as "uplink" transmissions. Depending upon the design criteria of a given system, the prior art wireless communication systems have typically used either time division duplexing (TDD) or frequency division duplexing (FDD) methods to facilitate the exchange of information between the base station and the subscriber units. Both the TDD and FDD duplexing schemes are well known in the art.

Recently, wideband or "broadband" wireless communications networks have been proposed for delivery of enhanced broadband services such as voice, data and video. The broadband wireless communication system facilitates two-way communication between a plurality of base stations and a plurality of fixed subscriber stations or Customer Premises Equipment (CPE). One exemplary broadband wireless communication system is described in the co-pending application Ser. No. 08/974,376 and is shown in the block diagram of FIG. 1. As shown in FIG. 1, an exemplary broadband wireless communication system 100 includes a plurality of cells 102. Each cell 102 contains an associated cell site 104 that primarily includes a base station 106 and an active antenna array 108. Each cell 102 provides wireless connectivity between the cell's base station 106 and a plurality of customer premises equipment (CPE) 110 positioned at fixed customer sites 112 throughout the coverage area of the cell 102. The users of the system 100 may include both residential and business customers. Consequently, the users of the system have different and varying usage and bandwidth requirement needs. Each cell may service several hundred or more residential and business CPEs.

The broadband wireless communication system 100 of FIG. 1 provides true "bandwidth-on-demand" to the plurality of CPEs 110. CPEs 110 request bandwidth allocations from their respective base stations 106 based upon the type and quality of services requested by the customers served by the CPEs. Different broadband services have different bandwidth and latency requirements. The type and quality of services available to the customers are variable and selectable. The base station media access control ("MAC") allocates available bandwidth on a physical channel on the uplink and the downlink. Within the uplink and downlink sub-frames, the base station MAC allocates the available bandwidth between the various services depending upon the priorities and rules imposed by their quality of service ("QoS"). The MAC transports data between a MAC "layer" (information higher layers such as TCP/IP) and a "physical layer" (information on the physical channel).

Due to several well known communication phenomenon occurring in the transmission link between the base stations 106 and the CPEs 112, it is well known that the transmission links or channels may be noisy and thereby produce errors during transmission. These errors are typically measured as Bit Error Rates (BERs) that are produced during data transmission. Depending upon the severity of these errors, communication between the base stations 106 and the CPEs 112 can be detrimentally affected. As is well known, by properly encoding data, errors introduced by noisy channels can be reduced to any desired level without sacrificing the rate of information transmission or storage. Since Shannon first demonstrated this concept in his landmark 1948 paper entitled "A Mathematical Theory of Communication", by C. E. Shannon, published in the Bell System Technical Journal, pps. 379–423 (Part I), 623–656(Part II), in July 1948, a great deal of effort has been put forth on devising efficient coding and encoding methods for error control in a noisy communication environment. Consequently, use of error correcting coding schemes has become an integral part in the design of modern communication systems.

For example, in order to compensate for the detrimental effects produced by noisy communication channels (or for noise that may be generated at both the sources and destinations), the data exchanged between the base stations 106 and the CPEs 112 of the system 100 of FIG. 1 may be coded using conventional combined coding and modulation designs. For example, convolutional or trellis-coded modulation (TCM)-Reed-Solomon (RS) type coders are well known in the art and can be used to code the data as it is exchanged in the system 100 of FIG. 6. Convolutional or TCM-RS concatenation coding schemes are well known in the communication art as exemplified by their description in the text entitled "Convolutional Coding, Fundamentals and Applications", by L. H. Charles Lee, published by Artech House, Inc. in 1997, the entire text of which is hereby fully incorporated by reference for its teachings on convolutional/TCM-RS coding schemes and techniques. As is well known, in the past, channel coding designs and modulation designs were treated as separate entities. Hamming distance was considered an appropriate measure for system design. TCM design offers the optimum matching between the channel encoder output code vector and the modulator using a special signal mapping technique.

As is well known, the coding gains produced by coding schemes employing convolutional or TCM coding schemes for the inner codes and RS for the outer codes (i.e., concatenating the convolutional/TCM inner codes with the RS outer codes) is relatively high in terms of the minimum Hamming distance and coding rates achieved. Disadvantageously, the high coding gains achieved by these conventional schemes come at a price in terms of complexity, cost, size, speed, data transmission delays and power.

As is well known to those of skill in the art, one of the main disadvantages associated with the prior art concatenated coding schemes is that these techniques require the use of symbol "interleavers". The Convolutional/TCM-RS concatenation techniques must employ a symbol interleaver between the outer and inner codes because when the inner code decoder makes a decoding error, it usually produces a long burst of errors that affect multiple consecutive symbols of the outer decoder. Thus without a deinterleaver, the performance of the outer decoder severely degrades and the effective coding gains produced by the concatenation is lost. Furthermore, the presence of interleaver/deinterleaver distributes the error bursts over multiple outer code words thereby effectively utilizing the power of the outer codes. In communication systems that transmit only short or variable length packets, a symbol interleaver cannot be utilized because it is impractical. In addition, the symbol interleaver required by the prior art concatenated channel coding schemes increase delays in data transmission.

These increased transmission delays may be unacceptable in some applications. For example, when the system 100 of FIG. 1 is used to communicate T1-type continuous data services between the base stations and the CPEs. These type of data services often have well-controlled delivery latency requirements that may not tolerate the transmission delays introduced by the symbol interleavers utilized by the concatenated channel coding schemes of the prior art.

A second disadvantage associated with the prior art concatenated coding schemes is that these techniques require additional overhead for trellis termination at the end of packets. This additional overhead lessens the effective coding gains obtained via concatenation. A third disadvantage associated with the prior art concatenated coding schemes is the use of Viterbi decoders for constraint length 7 codes. As is well known to those of skill in the art, constraint length 7 Viterbi decoders cause significant decoding delays that are undesirable for packet data transmissions. Furthermore, these decoders are relatively complex and therefore must be implemented using devices having increased cost and power characteristics.

The prior art concatenated channel coding schemes are relatively complex to implement and therefore suffer the power, size, and reliability disadvantages as compared with less complex implementations. As a result, prior art channel coding implementations for packet data transmission systems have typically used "single level" coding techniques such as convolutional, TCM or block coding techniques. Examples of block codes are Bose-Chaudhuri-Hocquenghem (BCH) codes, Reed-Muller (RM) codes, cyclic codes, array codes, single-error-correcting (SEC) Hamming codes, and Reed-Solomon (RS) codes. Therefore, disadvantageously, packet transmission systems, have not heretofore been able to take advantage of the benefits offered by conventional concatenation coding techniques that provide the advantage of soft-decision decoding of the inner code resulting in larger coding gain and better coding efficiencies.

Therefore, a need exists for a concatenated channel coding method and apparatus that can be easily implemented, provides acceptable coding performance, is well suited for use in small or variable size packet data transmission systems, and overcomes the disadvantages of the prior art concatenated channel coding methods and apparatuses. Specifically, a need exists for a concatenated channel coding method and apparatus that requires no additional overhead caused by trellis termination and reduces implementation complexity and decoding delays. Furthermore, a need exists for a concatenated channel coding method and apparatus for packet data transmission that allows for varying coding gain. The present invention provides such a concatenated coding method and apparatus.

SUMMARY OF THE INVENTION

The present invention is a novel method and apparatus for efficiently coding data in a data transmission system. The inventive concatenated channel coding technique is well suited for small or variable size packet data transmission systems. The technique may also be adapted for use in a continuous mode data transmission system. The method and apparatus reduces the complexity, cost, size and power consumption typically associated with the prior art channel coding methods and apparatuses, while still achieving acceptable coding performance. The present invention advantageously performs concatenated channel coding without the necessity of a symbol interleaver. In addition, the present invention is simple to implement and thereby consumes much less space and power that do the prior art approaches. The present invention not only eliminates the need for a symbol interleaver between the outer and inner codes, but it also enjoys a drastically reduced implementation complexity of the inner code Viterbi decoder.

The inventive concatenation technique does not require a symbol interleaver (or deinterleaver on the decoder end) because when the inner code makes a decoding error, it produces only single or a limited number of outer code symbol errors. The present method and apparatus either corrects for the noisy received symbol using a soft decision decoding technique or it produces the erroneous symbol on the output. Consequently, the inner code can be considered as being completely matched or in other words completely dedicated to the task of assisting the outer code in working best.

The asymptotic coding gain of a code decoded with optimum decoding is given as $10\log_{10}(r\, d_{min})$, where r is the code rate and $d_{min}$ is the minimum Hamming distance of the code. The convolutional/TCM code employed in the conventional concatenated coding usually use an inner code having larger $d_{min}$ but the code rate is usually low. The higher the $d_{min}$, the more complex the code usually is. In accordance with the present inventive coding technique, an inner code is selected to have a relatively modest $d_{min}$ value. However, the coding rate is improved and better than the code used by the conventional prior art concatenated coding schemes. Another important parameter which has affect on the performance is $N_{dmin}$. This is the number of paths at distance $d_{min}$ from the correct path. Low values of $N_{dmin}$ are desirable for better performance. But usually, the higher the $d_{min}$, the more complex the code is to implement and it also has lower rate and higher $N_{dmin}$.

The inner codes used by the present inventive coding technique have the following three advantages as compared to the prior art approaches: (1) the inner code is matched to the requirements and characteristics of the outer code (this assists the outer decoder in decoding the code in an optimum manner; (2) the inner code yields a coding technique having moderately high coding rates thereby providing good coding gains with modest $d_{min}$ values; and (3) the inner code yields low values of $N_{dmin}$.

One preferred embodiment of the present invention comprises an inner code having short length block codes derived from short constraint length convolutional codes. The present invention utilizes trellis tailbiting and a decoder comprising four four-state Viterbi decoders having a short corresponding maximum length. The inner code preferably comprises short block codes derived from a four-state (i.e., a constraint length of 3), nonsystematic, punctured and unpunctured convolutional code. The inner code also preferably utilizes trellis tailbiting techniques. One significant advantage of the preferred embodiment of the present concatenated coding technique is that packet data transmission systems can be designed to have variable coding gains and coding rates.

In the preferred embodiment of the present invention, the outer code is a (N,K) Reed-Solomon code over GF ($2^m$). The inner code preferably is a (m+1, m) parity-check code. The minimum Hamming distance $d_{min}$ of the inner code is 2. The overall code rate is given by the following equation (Equation 1):

$$r = \frac{Km}{N(m+1)} = \frac{Km}{(K+R)(m+1)}; \quad \text{Equation 1}$$

where R is the redundancy of the RS code, N is the length (measured in symbols) of the RS code, K is the message length (in symbols), and m is the length of the symbol in bits.

The single parity can be computed in parallel by an exclusive-OR of m-input bit. Alternatively, the single parity bit can be computed in a sequential manner with a single shift register and a single exclusive-OR gate.

BRIEF DESCRIPTION OF THE DRAWINGS

Like reference numbers and designations in the various drawings indicate like elements.

DETAILED DESCRIPTION OF THE INVENTION

Figure 1:
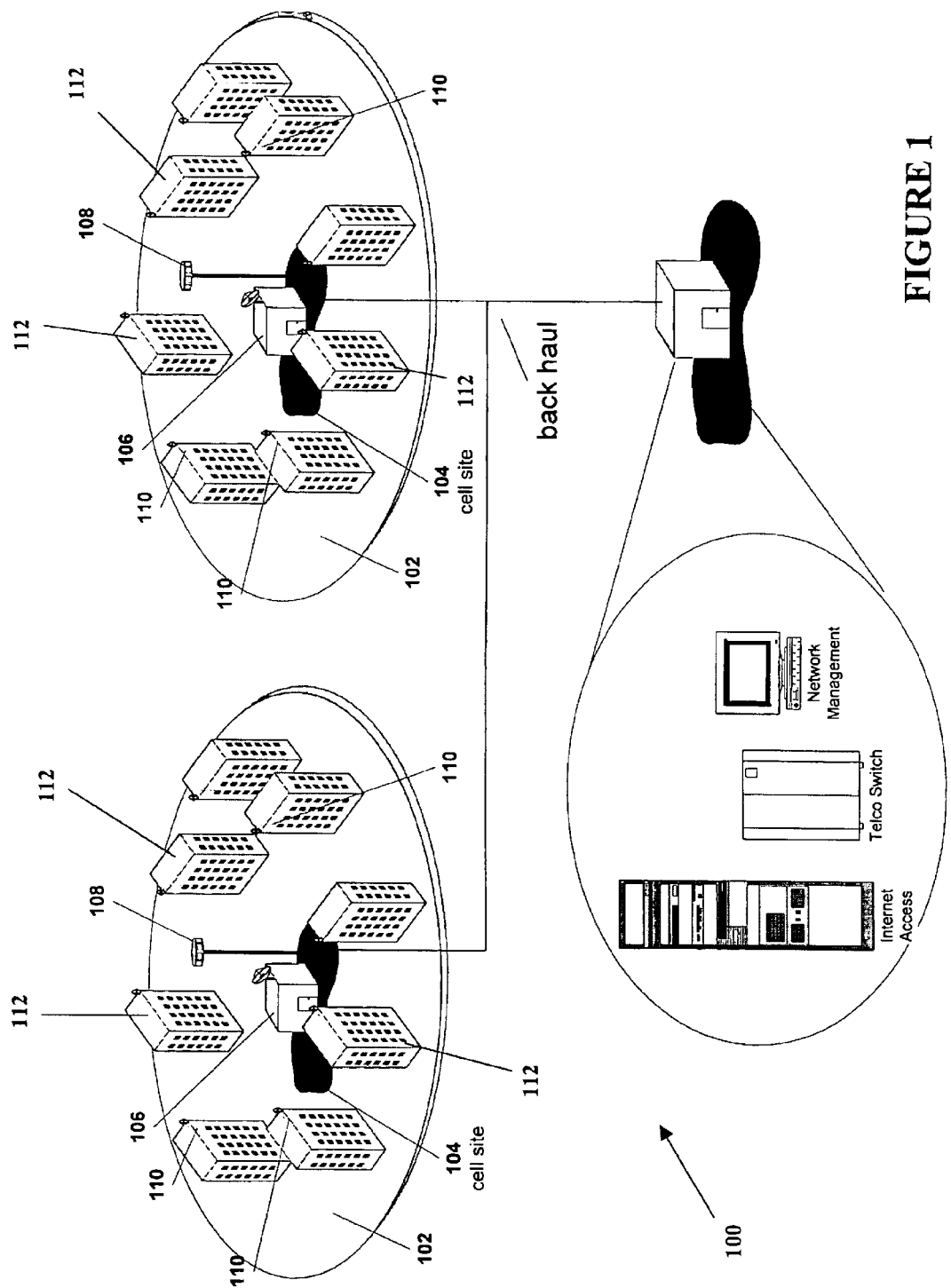
FIG. 1 is a simplified block diagram of a broadband wireless communication system adapted for use with the present invention.

Throughout this description, the preferred embodiment and examples shown should be considered as exemplars, rather than as limitations on the present invention.

One significant advantage of the present concatenated coding technique is that it not only eliminates the need for a symbol interleaver between the outer and inner codes, but it also enjoys drastically reduced implementation complexity of the inner code Viterbi decoder. That is, the Viterbi decoder used to implement the inner code is much less complex than those required by the prior art approaches. Viterbi coders/decoders are well known in the art and are described in much more detail in a text by Shu Lin and Daniel Costello, Jr., entitled "Error Control Coding, Fundamentals and Applications", published by Prentice Hall in 1983, the entire text of which is hereby incorporated by reference herein for its teachings on error control coding.

The present inventive concatenation technique does not require use of an interleaver/deinterleaver because when the inner code makes a decoding error it produces either only a single or a few outer code symbol errors. In accordance with the present invention, the decoder either "cleans" a noisy received symbol with the aid of soft decision decoding method, or it generates the erroneous symbol. Thus, the inner code in the new system can be considered completely matched, or, in other words, completely dedicated to the task of aiding the performance of the outer code.

As is well known, the asymptotic coding gain of a code decoded with optimum decoding is given as $10\log_{10}(r\, d_{min})$, where r is the code rate and $d_{min}$ is the minimum Hamming distance of the code. The prior art convolutional/TCM code employed in the prior art concatenated coders usually use an inner code having larger $d_{min}$ values. However, the code rate associated with these coders is usually low. The higher the $d_{min}$ value, the more complex is the code. In the concatenated coding scheme presented herein, an inner code is selected having a modest $d_{min}$ value. However, the coding rate is superior to the code used in conventional concatenated code schemes. Also, as is well known, another important parameter which has affect on the performance is $N_{dmin}$. This is the number of paths at distance $d_{min}$ from the correct path. Low values of $N_{dmin}$ are desirable for better performance. Usually, however, the higher the $d_{min}$ value is, the more complex is the code to implement. In addition, it also has a lower rate and a higher $N_{dmin}$ value.

The strength of the inner code used in the inventive concatenated coding technique can be summarized as follows: (1) the inner code is matched to the needs and characteristics of the outer code, thus helping the outer decoder in an optimum manner; (2) the inner codes have medium to high coding rates thus providing acceptable coding gain even with modest $d_{min}$; and (3) the inner codes yield relatively low values of $N_{dmin}$. Note that for m=8, the asymptotic coding gain of the parity inner code is 10log10 (2*8/9)=2.49 dB.

Figure 2:
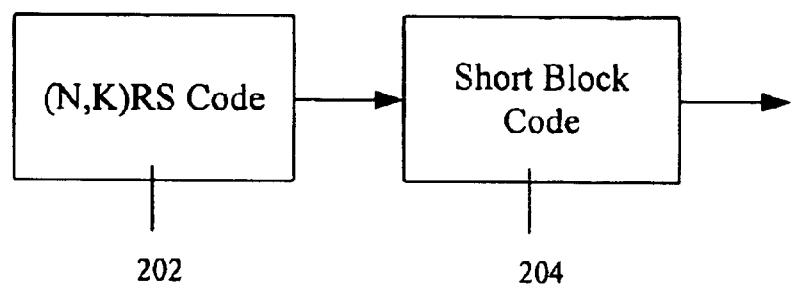
FIG. 2 is a simplified block diagram of an encoder made in accordance with the present invention.

FIG. 2 shows a simplified block diagram of an encoder made in accordance with the present invention. As shown in FIG. 2, the inventive encoder preferably comprises a concatenated channel encoder 200 having an outer code encoder 202 operatively coupled to an inner code encoder 204. The outer code encoder preferably uses an (N,K) Reed-Solomon code over GF($2^m$). These types of RS codes are well known in the art and can be implemented using the teachings provided in the text by Lin and Costello, fully incorporated herein as stated above. In accordance with the present invention, the inner encoder 204 preferably uses an inner code comprising an (m+1,m) parity-check code. Preferably, the minimum Hamming distance $d_{min}$, of the inner code is 2. The overall code rate r is given by the Equation 1:

$$r = \frac{Km}{N(m+1)} = \frac{Km}{(K+R)(m+1)} \qquad \text{Equation 1}$$

where, as stated above, R is the redundancy of the RS code; N is the length (measured in symbols) of the RS code, K is the message length (in symbols), and m is the length of the symbol in bits. The single parity bit can be computed in parallel using an exclusive-OR of m-input bit circuit. Alternatively, the single parity bit can be computed in a sequential manner with a single shift register and a single exclusive-OR gate in a well-known manner.

Figure 3:
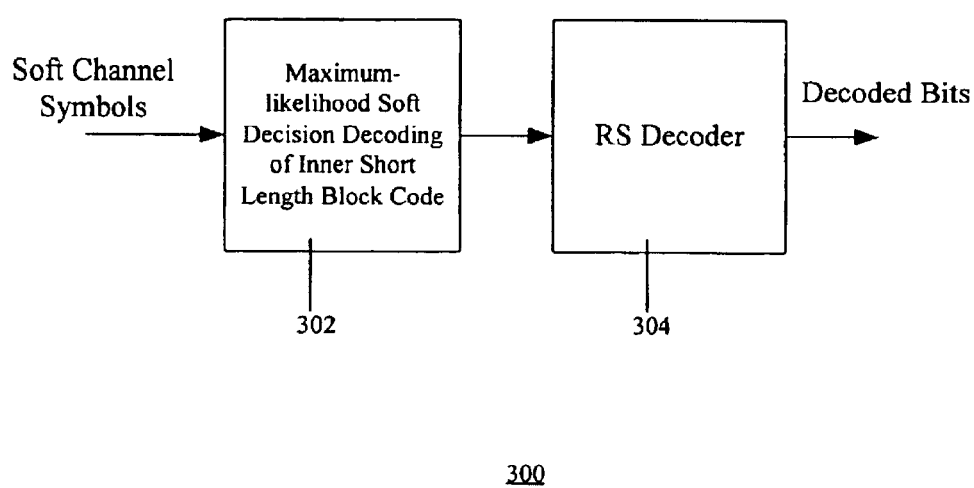
FIG. 3 is a simplified a block diagram of a decoder made in accordance with the present inventive concatenation channel coding method and apparatus.

FIG. 3 shows a block diagram of a decoder made in accordance with the present inventive concatenation channel coding method and apparatus. As shown in FIG. 3, the inventive decoder 300 preferably comprises a Maximum likelihood "soft decision" parity check code decoder 302 operatively coupled to an error-only or error and erasure RS code decoder 304. The parity check code decoder 302 accepts "soft channel bits" in a well known fashion from the communication channel and the demodulator. In the embodiment shown, the soft channel bits comprise "m+1" bits, while the input to the RS decoder 304 comprises "m" bits. The decoder is preferably implemented using a relatively non-complex soft-decision Viterbi decoder which is well known in the art. Such decoders are described in detail at pages 315–384 of the Lin and Costello reference which is incorporated by reference hereinabove.

Figure 4:
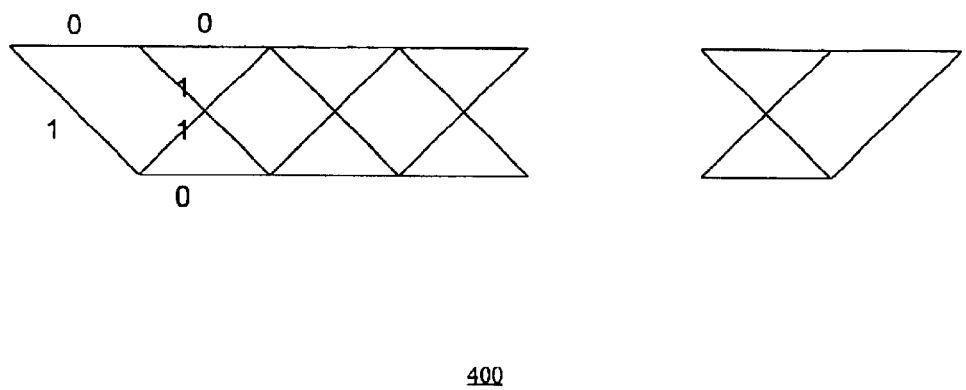
FIG. 4 shows a Trellis diagram of the parity check code in accordance with the present concatenated channel coding technique.

FIG. 4 shows a Trellis diagram 400 of the (m+1,m) parity check code in accordance with the present concatenated channel coding technique. As shown in FIG. 4, the inner code has 2-states trellis diagram with (m+1) stages in the trellis. Hence it can be decoded using a very simple and straightforward soft-decision Viterbi decoder. The trellis terminates to zero state in (m+1) stages. Note that since there are only two states in the trellis and length of the trellis is a small number m (typical value for m is "8"), a register exchange method can be utilized for storing the decoded path through the trellis. Thus, advantageously, there is no decoding delay through this simple 2-states Viterbi decoder. In comparison, disadvantageously, the Viterbi decoder used by the prior art concatenated coding schemes employing convolutional/TCM codes is much more complex and has significant decoding delays.

In an alternative embodiment, the inner code can be decoded by (1) performing a correlation of the received vector of length "m" with $2^m$ possible code words, and (2) selecting as the decoded output the code word that has a maximum correlation metric. This is a relatively "brute-force" approach for performing optimum decoding. The trellis is a much more efficient way to perform the same task.

Alternatively, if the input bit rate is relatively high, it may be desirable to process multiple input samples in parallel. The trellis diagram of FIG. 4 can easily be modified to implement this modified approach. This results in a trellis having an increased number of branches but of shorter length.

For example, if the inner code is (9,8) code, then it is possible to combine the three stages in the trellis into a single stage and process three input bits at a time. These are only a few examples of possible alternative implementations possible for the inner code decoder. Essentially these are all equivalent implementations. As one of ordinary skill in the art shall recognize, many alternative implementation approaches may be used without departing from the scope of the present invention.

The inner code works with all types of signal constellations. For higher level constellations such as 16 QAM, multiple branch metrics are computed for a single received I,Q pair as follows.

For example, let (b3, b2, b1, b0) represent the 4-bit binary label of a 16 QAM signal constellation. Let y denote the received signal point and S denote the set of 16 QAM signal points for which b3=0. Then the branch metric for bit b3 for hypothesis 0 is given by:

$$\min_{x \in S} |y - x|^2$$

Similarly the metrics for other hypothesis and other bits are computed. It is possible to use the distance rather than the squared distance for the branch metrics. A bit permutator between the inner encoder and modulation symbol mapper may be employed to make the branch metrics in the consecutive stages of the trellis uncorrelated for higher level modulations. This approach may slightly improve the concatenated code performance.

Performance Characteristics using the Present Inventive Channel Coding Techniques Performance characteristics of the inventive coding method and apparatus are now provided. The performance characteristics of an error-only RS decoding technique are described.

The error event probability of the inner code with BPSK or QPSK modulation and decoded with maximum-likelihood soft decision Viterbi decoding is given by the following upper bound (Equation 2):

$$P_e < \sum_{d=d_{min}}^{\infty} a_d Q(\sqrt{2rdE_b/N_0}); \qquad \text{Equation 2}$$

where, $a_d$ is the number of incorrect paths at Hamming distance d from the correct path that diverge from the correct path and remerge to it at some later stage. One of ordinary skill in the coding/decoding art shall recognize that from the trellis diagram of FIG. 4, for $$(m+1, m)\text{parity check code } a_{dmin} = \binom{m}{1} + \binom{m}{2} \text{ where } \binom{m}{k} = \frac{m!}{k!(m-k)!}.$$

At higher SNR, only the first term is significant. Ignoring the higher order terms convert the above bound (of Equation 2) into an approximate expression. Hence the probability of symbol error at the input of the RS decoder can be given by the following expression (Equation 3):

$$P_s \approx \left[\binom{m}{1} + \binom{m}{2}\right] Q(\sqrt{4rE_b/N_0})  \quad \text{Equation 3}$$

The block error probability of the RS code with redundancy R is given by the following equation (Equation 4):

$$P_{block} = \sum_{i=R/2+1}^{N} \binom{N}{i}(P_s)^i(1-P_s)^{N-i} \quad \text{Equation 4}$$

Once again, at higher SNR, only the first term in the summation given above is significant. The bit error probability at the output of RS decoder is approximately given by the following expression (Equation 5):

$$P_b \approx 2 \frac{\frac{R}{2}+1}{Nm}\binom{N}{\frac{R}{2}+1}(P_s)^{\frac{R}{2}+1}(1-P_s)^{N-(\frac{R}{2}+1)} \quad \text{Equation 5}$$

Figure 5:
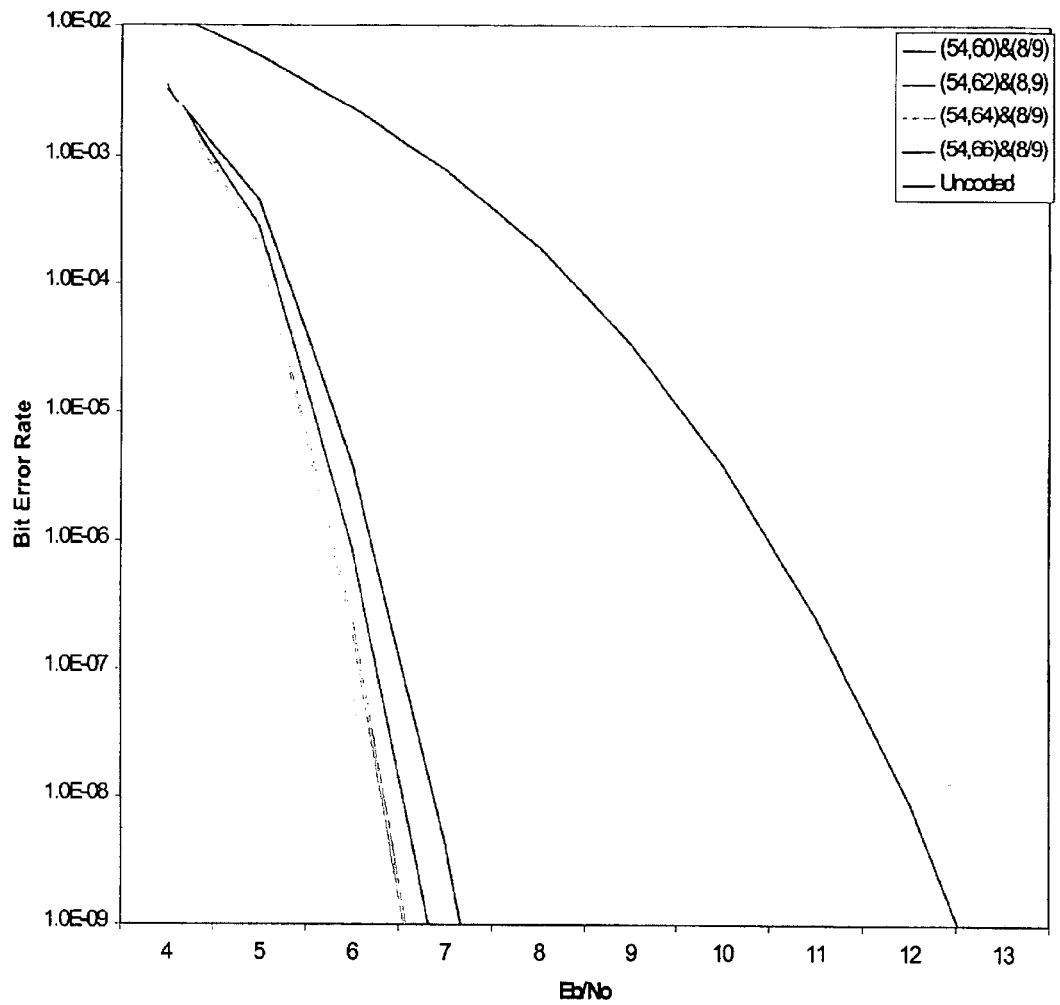
FIG. 5 depicts a graph showing the performance of a data transmission system using QPSK modulation and the concatenated channel coding technique of the present invention.

An example is now described. Let K=54 bytes, thus m=8. FIG. 5 depicts a graph showing the performance of a data transmission system using QPSK modulation and the concatenated channel coding technique of the present invention. The bit error rate of this concatenated system is shown in FIG. 5 for R=6, 8, 10 and 12. At $10^{-9}$ output BER, the coding gain and overall code rate for these 4 codes are presented in Table 1 below.

In one alternative embodiment, the Viterbi decoder of FIG. 3 can be modified such that it outputs reliability information for each symbol that is generated. An error and erasure correcting RS decoder can then be used to further improve the performance of the system using the present invention.

TABLE 1

The Code Rate and Gain for the Exemplary system using Inventive Concatenated Coding Scheme

| R | Code Rate | Coding Gain (dB) |
|---|---|---|
| 6 | 0.80 | 5.30 |
| 8 | 0.774 | 5.65 |
| 10 | 0.75 | 5.90 |
| 12 | 0.7272 | 6.10 |

Concatenated Coding Techniques having Variable Coding Gains and Coding Rates

One significant advantage of the preferred embodiment of the present concatenated coding technique is that packet data transmission systems can be designed to have variable coding gains and rates. Thus, a designer of such a system can choose to design the system to have a higher coding gain at a cost of a lower coding efficiency, and vice versa. Another advantage of the present invention is the elimination of the need for a symbol interleaver between the outer and inner codes.

The preferred embodiment of the present invention offers the same coding rate flexibility as a standard RS/convolutional concatenated code while producing similar or better coding gain. Several advantages of utilizing the preferred embodiment of the present invention instead of the standard RS/convolutional concatenated code are now discussed. First, the present invention utilizes trellis tailbiting, which requires no additional overhead for trellis termination. Disadvantageously, the standard code having a constraint length 7 code requires an additional overhead of 6 bits at the end of each packet for trellis termination. Second, the inner code of the present invention enjoys drastically reduced implementation complexity than a constraint length 7 standard code. The present inner code decoder is only slightly more complicated than a parity check decoder. Third, the inner code of the present invention enjoys a much smaller decoding delay than the delays observed using a constraint length 7 standard code, and thus, provides a well-suited mechanism for packet data transmission. Fourth, as described above, the present invention does not require use of an interleaver; however, the present invention can utilize a relatively small size interleaver and provide additional coding gain. For example, a depth 4 interleaver provides an additional 0.5 to 1.0 dB of coding gain. Fifth, the present invention can be used for both uplink and downlink communication channels without interleaving, and thus provides equal coding gains for both uplink and downlink. One preferred embodiment of the present invention is now described.

The preferred embodiment of the present invention comprises an inner code having short length block codes derived from short constraint length convolutional codes utilizing trellis tailbiting and a decoder comprising $2^{k-1}$ $2^{k-1}$ states Viterbi decoders having a short corresponding maximum length, where "k" is the constraint length of the code. The inner code preferably comprises short block codes derived from four-state (i.e., constraint length 3), nonsystematic, punctured and unpunctured convolutional codes. Punctured convolutional codes are well known in the art and one such technique of providing punctured convolutional codes is described in detail in U.S. Pat. No. 5,511,082 issued to How et al., on Apr. 23, 1996, entitled "Punctured Convolutional Encoder", the entire reference hereby incorporated by reference herein for its teachings on communication encoding. The generator polynomials of the inner code are preferably 7 and 5. The inner code preferably utilizes trellis tailbiting techniques (e.g., utilizing the last K-1 bits of a block to initialize encoder memory, where K is the constraint length). Trellis tailbiting techniques are well known in the art. One such technique is described in detail in an article by Jack Keil Wolf and Andrew J. Viterbi, entitled "On the Weight Distribution of Linear Block Codes Formed From Convolutional Codes", published by IEEE in the IEEE Transactions on Communications Vol. 44, No. 9, September 1996, the entire text of which is hereby incorporated by reference herein for its teachings on coding techniques.

The present invention preferably utilizes trellis tailbiting (instead of utilizing trellis termination) because the use of trellis termination for short length block codes results in excessive rate loss. The present invention preferably utilizes a relatively short constraint length (e.g., 3 or 4) for the following reasons related to trellis tailbiting. As is well known to those skilled in the coding art, trellis tailbiting techniques generate block code lengths of a particular minimum size to obtain a weight distribution that is similar to the weight distribution obtained using trellis termination. The larger the constraint length is, the longer the block code length needs to be. This causes degraded performance of the outer codes because the inner codes generate correlated multiple symbol errors. The inner codes generate correlated symbol errors because the inner code message lengths usually do not match the outer code symbol sizes. This mismatch effect is more pronounced for higher constraint length codes. Trellis tailbiting techniques implemented for maximum likelihood decoding require $2^{k-1}$ trellises. This implies that trellis tailbiting is impractical for long constraint lengths. Thus, short constraint lengths of 3 or 4 are preferably used in the present invention. Three exemplary embodiments of the present invention are now described in detail.

A First Exemplary Embodiment—Inner Code K=3, Rate ½ Convolutional Code

A first exemplary embodiment comprises an inner code having a short length block code derived from an unpunctured rate ½ constraint length 3 convolutional code. For each inner code message block, trellis tailbiting requires that the encoder memory be initialized with the last two bits of the block. In the first exemplary embodiment the message length for the inner code is preferably equal to or greater than 8 bits. For outer RS codes based on $GF(2^n)$, the inner code message length in bits is preferably a multiple of n. Thus, for an outer RS code based on $GF(2^8)$, the inner code message length (in bits) is preferably a multiple of 8. Similarly, for an outer RS code based on $GF(2^9)$ or $GF(2^{10})$ the inner code message length (in bits) is preferably a multiple of 9 or 10, respectively. These configurations are exemplary only as those skilled in the coding art shall recognize that other configurations can be used with the present invention without departing from the scope and spirit of the present invention. For example, inner codes can be derived from higher constraint lengths, however, decoding complexity increases greatly and the minimum message length for the inner code also increases.

A Second Exemplary Embodiment—Inner Code K=3, Rate ⅔ Convolutional Code

A second exemplary embodiment comprises an inner code having a short length block code derived from a punctured rate ⅔ constraint length 3 convolutional code. For each inner code message block, trellis tailbiting requires that the encoder memory be initialized with the last two bits of the block. The punctured pattern is preferably 11 and 10 corresponding to generator polynomials 7 and 5, respectively. This punctured pattern is exemplary only as one skilled in the art shall recognize that other punctured patterns can be used with the present invention without departing from the spirit of the invention. The inner code length of the second exemplary embodiment is preferably equal to or greater than 8 bits and a multiple of the puncture period (i.e., 2). As described above with reference to the first exemplary embodiment, for outer RS codes based on $GF(2^8)$, the inner code message length (in bits) is preferably a multiple of 8. Thus, advantageously, the same inner code decoder can be used for both the first and the second exemplary embodiments.

A Third Exemplary Embodiment—Inner Code K=3, Rate ⅘ Convolutional Code

A third exemplary embodiment of the present invention comprises an inner code having a short length block code derived from a punctured rate ⅘ constraint length 3 convolutional code. For each inner code message block, trellis tailbiting requires that the encoder memory be initialized with the last two bits of the block. The punctured pattern is preferably 1001 and 1110, corresponding to generator polynomials 7 and 5, respectively. This punctured pattern is exemplary only as one skilled in the art shall recognize that other punctured patterns can be used with the present invention without departing from the spirit of the invention. The inner code length of the third exemplary embodiment is preferably equal to or greater than 16 bits and a multiple of the puncture period (i.e., 4). As described above with reference to the first and second exemplary embodiments, for outer RS codes based on $GF(2^8)$ the inner code message length in bits is preferably a multiple of 8. Thus, advantageously, the same inner code decoder can be used for all three exemplary embodiments of the present invention.

Performance Characteristics of the Exemplary Embodiments of the Present Inventive Channel Coding Technique Performance characteristics of the exemplary embodiments of the inventive coding method and apparatus are now provided. BER performance characteristics of the above-described exemplary embodiments of the present inventive concatenated coding method and apparatus are calculated using a semi-analytical method. The semi-analytical method is described hereinbelow for an inner code message length of 32 bits and a $GF(2^8)$-based RS outer code. One skilled in the art shall recognize that different inner code message lengths and RS symbol sizes can be utilized with the present semi-analytical method to provide performance characteristics of the present invention.

The bit error probability ($P_b$) is the probability of a bit error occurring at the output of the inner code decoder. Similarly, the byte error probability ($P_{byte}$) is the probability of a byte error occurring at the output of the inner code decoder. $P_w$, $P_x$, $P_y$, and $P_z$ represent the probabilities of a 32-bit decoded word having 1, 2, 3 and 4 byte errors, respectively, occurring at the output of the inner code decoder. The BERs at the output of a t-byte correcting RS decoder ($(P_e)_{RS}$) can be given by the following expression (Equation 6), where $N=(M+2t)/4$ and M is the message size in bytes:

$$(P_e)_{RS} = \frac{P_b}{P_{byte}} \sum_{\substack{w+2x+3y+4z>t \\ w+x+y+z \leq N \\ 0 \leq w,x,y,z \leq N}} \frac{w+2x+3y+4z}{4N} \binom{N}{w}\binom{N-w}{x}\binom{N-w-x}{y}\binom{N-w-x-y}{z}$$

$$P_w^w P_x^x P_y^y P_z^z (1 - P_w - P_x - P_y - P_z)^{N-w-x-y-z}$$

Equation 6

Those skilled in the coding arts shall recognize that the probabilities $P_b$, $P_{byte}$, $P_w$, $P_x$, $P_y$, and $P_z$ can be obtained from simulations for different Eb/No. Preferably at least 500 error events of each type are simulated to ensure the accuracy of the probabilities obtained via simulation. Equation 6 is preferably evaluated using a computer or similar device because of the large number of terms within the equation. The BER performance characteristics of the above-described exemplary embodiments are now described with reference to FIGS. 6–8.

Figure 6:
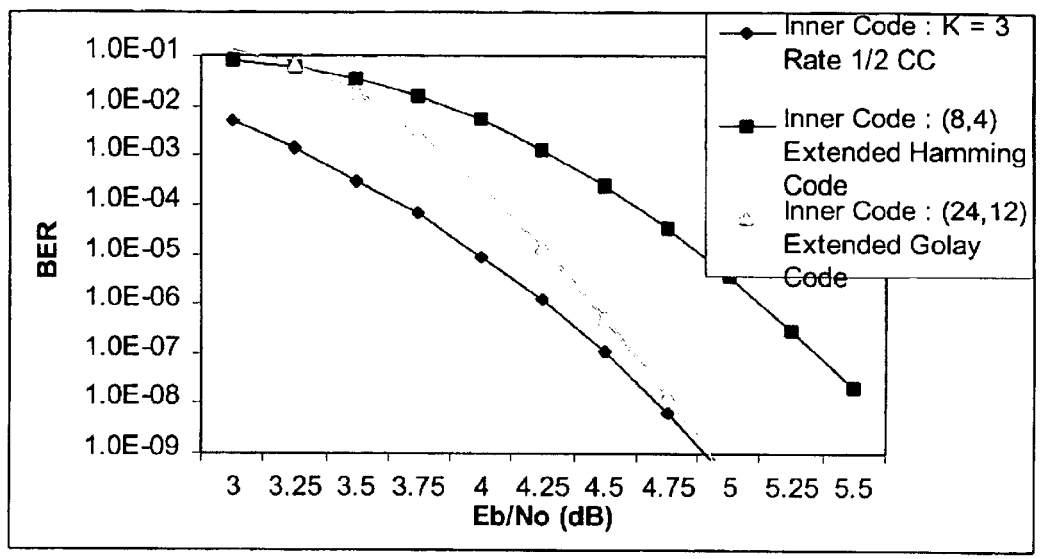
FIG. 6 depicts a graph showing the BER performance characteristics of a first exemplary embodiment of the present invention.

FIG. 6 depicts a graph showing the BER performance characteristics of the first exemplary embodiment of the present invention, a concatenated code having an inner code based on (8,4) extended Hamming code and a concatenated code having an inner code based on (24, 12) extended Golay code. The BER performance of the first exemplary embodiment of the present invention shown in FIG. 6 is for a message block length of 56 bytes, RS code redundancy of 16 bytes and inner code message length of 8 bits. The overall code rate of this exemplary embodiment is 0.38.

For comparison purposes, FIG. 6 depicts two concatenated codes having inner codes based on an (8,4) extended Hamming code and a (24, 12) extended Golay code. If these codes are decoded with trellis-based maximum likelihood decoding algorithms, they will generally have higher complexity trellises (either more states and/or time varying irregular trellises) than the present invention. Thus, utilization of the Hamming code and Golay code result in a more complex inner code decoder. The Hamming code utilizes a $GF(2^8)$ based RS code and the Golay code utilizes a $GF(2^{12})$ based RS code.

As shown in FIG. 6, the new concatenated code outperforms the Hamming-based concatenated code by 0.75 dB. The powerful Golay-based concatenated code only approaches the performance of the first exemplary embodiment at an output BER of $10^{-9}$. As is well known, the implementation complexity of an (8,4) Hamming code is comparable or slightly higher than the inner code of the first exemplary embodiment, whereas disadvantageously, the implementation complexity of the maximum likelihood Golay code decoder is an order of magnitude higher. One skilled in the art shall recognize that an RS/constraint length 7 rate ½ concatenated code without interleaving has the same performance as the first exemplary embodiment, but at the cost of much higher decoding complexity and decoding delay.

Figure 7:
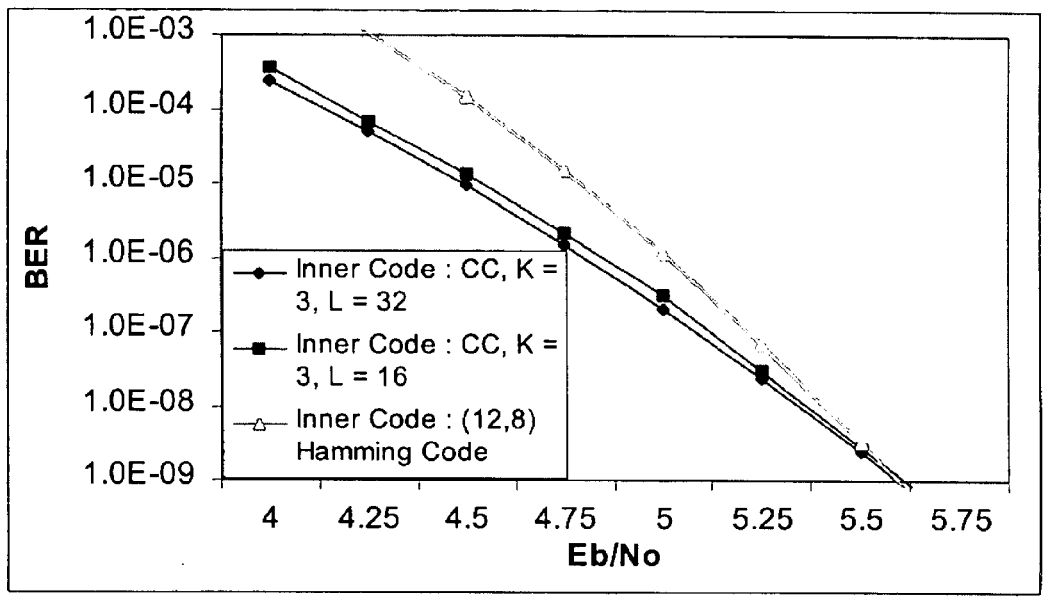
FIG. 7 depicts a graph showing the BER performance characteristics of a second exemplary embodiment of the present invention.

FIG. 7 depicts a graph showing the BER performance characteristics of the second exemplary embodiment of the present invention having an inner code message length of 16 bits, an inner code message length of 32 bits and a concatenated code having an inner code based on (12,8) shortened Hamming code. The BER performance characteristics of the second exemplary embodiment of the present invention shown in FIG. 7 are for a message block length of 56 bytes, RS code redundancy of 16 bytes and inner code message length of 16 and 32 bits. The overall code rate of this exemplary embodiment is 0.51.

As shown in FIG. 7, the second exemplary embodiment outperforms the more complex Hamming-based concatenated code system for BER outputs up to $10^{-9}$, which, as is well known, is a typical operating region for high datarate/high-performance systems. One skilled in the art shall recognize that, disadvantageously, a (12,8) Hamming code decoder is necessarily different from a (8,4) Hamming code decoder. Thus, implementing both Hamming code rates requires implementation of a separate decoder for each rate. Advantageously, the present invention utilizes one decoder for all rates.

Figure 8:
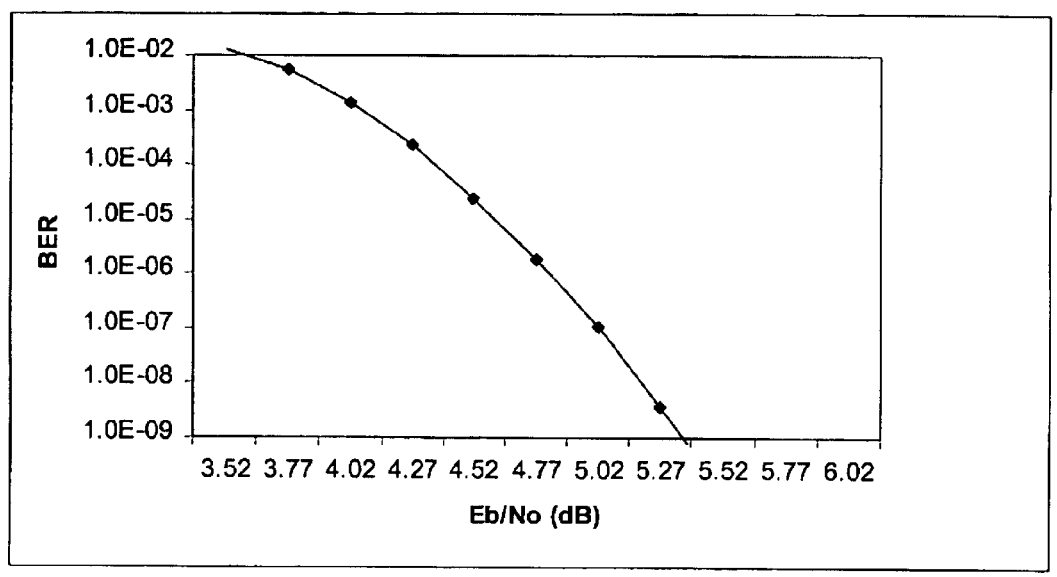
FIG. 8 depicts a graph showing the BER performance characteristics of a third exemplary embodiment of the present invention.

FIG. 8 depicts a graph showing the BER performance characteristics of the third exemplary embodiment of the present invention having an inner code message length of 32 bits. The BER performance characteristics of the third exemplary embodiment of the present invention shown in FIG. 8 are for a message block length of 212 bytes, RS code redundancy of 32 bytes and inner code message length of 32 bits. The overall code rate of this exemplary embodiment is 0.71.

Summary:

A novel inventive concatenated coding scheme has been described, wherein the outer code comprises an RS code over $GF(2^m)$ and the inner code comprises a (m+1,m) single parity check code. The inner code is preferably decoded using maximum likelihood soft-decision decoding such as is performed using a Viterbi decoding method. In one embodiment, information is provided to the outer decoder regarding the reliability of the symbol that is decoded. The outer decoder preferably comprises either an error-only or error and erasure correcting RS decoder. The preferred embodiment of the present invention comprises an inner code having short length block codes derived from short constraint length convolutional codes utilizing trellis tailbiting and a decoder comprising four four-state Viterbi decoders having a short corresponding maximum length. The inner code preferably comprises short block codes derived from four-state (i.e., constraint length 3), nonsystematic, punctured and unpunctured convolutional code. The inner code also preferably utilizes trellis tailbiting techniques.

One significant advantage of the preferred embodiment of the present concatenated coding technique is that packet data transmission systems can be designed to have variable coding gains and coding rates. Another advantage of the present invention is that the need for a symbol interleaves between the outer and inner codes is eliminated. The preferred embodiment of the present invention offers the same coding rate flexibility as a standard RS/convolutional concatenated code while producing similar or better coding gains.

Three exemplary concatenated coding schemes have been described. These schemes are well suited for packet data transmission and also have much simpler implementation complexity than the prior art schemes. The coding schemes of the present invention are remarkably simple to implement (requires only a small number of states Viterbi decoder of short length) and provide variable coding gains with variable code rates. The exemplary decoder consists of four four-state Viterbi decoders of a maximum length of 32. Implementation of the exemplary decoder is very simple because it does not require traceback memory, traceback mechanisms, path metrics normalization, etc. that are required in the implementation of a typical Viterbi decoder that has a larger constraint length and a larger block length. All three exemplary schemes share the same decoder for decoding the inner codes. The three exemplary schemes provide the same or better performance than provided by prior art techniques yet at a drastically reduced implementation complexity.

A further performance improvement is realized when interleaving of short depth (e.g. 2 or 4) is used for continuous data transmission systems. Thus, the present invention can be effectively utilized in applications where implementation costs, decoding delays or chip power consumption issues are paramount. Those skilled in the coding arts shall recognize that different length block codes derived from different constraint length convolutional codes having different puncture patterns, different RS symbol sizes, and different numbers of redundancies, can be used to practice the present inventive coding method and apparatus without departing from the scope and spirit of the present invention. Thus, these parameters can be varied to obtain a large number of viable concatenated coding systems useful for different applications.

A number of embodiments of the present invention have been described. Nevertheless, it will be understood that various modifications may be made without departing from the spirit and scope of the present invention. For example, the actual implementation of the encoder (and decoder) described above may be implemented in an integrated circuit device, software, firmware, in a combinational logic circuit, Read-Only Memory, parallel clocking circuit, or serial circuit as described above. Furthermore, the present inventive method and apparatus can be used in virtually any type of communication system. Its use is not limited to a wireless communication system. Alternatively, the present invention can be used in a wired communication system. Finally, the coding technique may be employed at any convenient location within the data communication system. The coder and decoder can reside in both the base stations 106 and CPEs 112 of the system of FIG. 1. Accordingly, it is to be understood that the invention is not to be limited by the specific illustrated embodiment, but only by the scope of the appended claims.

What is claimed is:

1. A method of concatenated channel coding of data in a data transmission system, comprising:
   (a) obtaining a plurality of data elements for encoding and transmission in a data transmission system;
   (b) generating an outer code for the plurality of data elements using an (N,K) Reed-Solomon (RS) code over GF($2^m$), where N is the length of the RS code, K is the message length and m is the length of a symbol, and
   (c) generating an inner code for the plurality of data elements using a (m+1, m) parity-check code;
   wherein the inner code comprises a plurality of short length block codes derived from a short constraint length convolutional code using trellis tailbiting.

2. The method of concatenated channel coding as defined in claim 1, wherein the short constraint length convolutional code has a constraint length equal to approximately 3.

3. The method of concatenated channel coding as defined in claim 1, wherein the short constraint length convolutional code has a constraint length equal to approximately 4.

4. The method of concatenated channel coding as defined in claim 1, wherein the plurality of short length block codes are derived from four-state nonsystematic, punctured convolutional codes.

5. The method of concatenated channel coding as defined in claim 1, wherein the plurality of short length block codes are derived from four-state nonsystematic, unpunctured convolutional codes.

6. The method of concatenated channel coding as defined in claim 1, wherein the plurality of short length block codes are derived from four-state nonsystematic, punctured and unpunctured convolutional codes.

7. The method of concatenated channel coding as defined in claim 1, wherein the inner code has a message length that is a multiple of m.

8. The method of concatenated channel coding as defined in claim 1, wherein the plurality of short length block codes are derived from an unpunctured rate ½ constraint length 3 convolutional code.

9. The method of concatenated channel coding as defined in claim 8 wherein the inner code has a message length equal to or greater than 8 bits.

10. The method of concatenated channel coding as defined in claim 8, wherein the inner code has a message length that is a multiple of 8.

11. The method of concatenated channel coding as defined in claim 1, wherein the plurality of short length block codes are derived from a punctured rate ⅔ constraint length 3 convolutional code.

12. The method of concatenated channel coding as defined in claim 11, wherein the inner code has a message length equal to or greater than 8 bits.

13. The method of concatenated channel coding as defined in claim 11, wherein the inner code has a message length equal to or greater than 8 bits and a multiple of a puncture period.

14. The method of concatenated channel coding as defined in claim 11, wherein the inner code has a message length that is a multiple of 8.

15. The method of concatenated channel coding as defined in claim 11, wherein the method utilizes a puncture pattern of 11 and 10.

16. The method of concatenated channel coding as defined in claim 1, wherein the plurality of short length block codes are derived from an punctured rate ⅘ constraint length 3 convolutional code.

17. The method of concatenated channel coding as defined in claim 16, wherein the inner code has a message length equal to or greater than 16 bits.

18. The method of concatenated channel coding as defined in claim 16, wherein the inner code has a message length equal to or greater than 16 bits and a multiple of a puncture period.

19. The method of concatenated channel coding as defined in claim 16, wherein the inner code has a message length that is a multiple of 8.

20. The method of concatenated channel coding as defined in claim 16; wherein the method utilizes a puncture pattern of 1001 and 1110.

21. The method of concatenated channel coding as defined in claim 1, further comprising:
   (d) decoding the plurality of data elements coded using the outer code generated in step (b) and the inner code generated in step (c).

22. The method of concatenated channel coding as defined in claim 21, wherein the decoding step (d) comprises:
   (1) decoding the inner code generated in step (c) using a parity-check code decoder, wherein the parity-check decoder generates a plurality of m decoded data bits associated and corresponding to the plurality of data elements obtained in step (a); and
   (2) decoding the plurality of m decoded data bits of sub-step (1) using an RS code decoder.

23. The method of concatenated channel coding as defined in claim 22, wherein the parity-check code decoder comprises a maximum likelihood soft decision parity-check code decoder.

24. The method of concatenated channel coding as defined in claim 1, wherein the coding steps (b) and (c) utilize a short-depth interleaver.

25. The method of concatenated channel coding as defined in claim 24, wherein the short-depth interleaver has a depth of 2.

26. The method of concatenated channel coding as defined in claim 24 wherein the short-depth interleaver has a depth of 4.

27. The method of concatenated channel coding as defined in claim 1, wherein the coding step (c) further comprises generating a bit-permutated inner code.

28. A concatenated channel encoder encoding data in a data transmission system, comprising:
   (a) means for obtaining a plurality of data elements for encoding and transmission in a data transmission system;
   (b) means, coupled to the data element obtaining means, for generating an outer code for the plurality of data elements using an (N,K) Reed-Solomon (RS) code over GF($2^m$), where N is the length of the RS code, K is the message length and m is the length of a symbol; and
   (c) means, coupled to the outer code generating means, for generating an inner code for the plurality of data elements using a (m+1, m) parity-check code;
   wherein the inner code comprises a plurality of short length block codes derived from a short constraint length convolutional code using trellis tailbiting.

29. A concatenated channel encoding apparatus, comprising:
   (a) an outer code encoder, wherein the outer code encoder generates an outer code for a plurality of data elements using an (N,K) Reed-Solomon (RS) code over $GF(2^m)$, where N is the length of the RS code, K is the message length and m is the length of a symbol, and
   (b) an inner code encoder, operatively coupled to the outer code encoder, wherein the inner code encoder generates an inner code for the plurality of data elements using a (m+1, m) parity-check code, and wherein the inner code comprises a plurality of short length block codes derived from a short constraint length convolutional code using trellis tailbiting.

30. A data coder/decoder (CODEC) adapted for use in a data communication system, wherein the data communication system includes a plurality of customer premise equipment (CPE) in communication with associated and corresponding base stations, and wherein the base stations each include an associated and corresponding media access control (MAC) having a plurality of MAC data messages, and wherein the MAC transports a MAC data message through a MAC data packet that is mapped to at least one TC/PHY packet in a layered data transport architecture, comprising:
   (a) an outer code encoder capable of encoding a plurality of data elements of a selected TC/PHY data packet using an (N,K) Reed-Solomon (RS) code over $GF(2^m)$ where N is the length of the RS code, K is the message length and m is the length of a symbol;
   (b) an inner code encoder, operatively coupled to an output of the outer code encoder, wherein the inner code encoder uses a (m+1, m) parity check code, and wherein the inner code encoder generates a plurality of code words associated with the plurality of data elements, and wherein the inner code comprises a plurality of short length block codes derived from a short constraint length convolutional code using trellis tailbiting; and
   (c) a decoder, operatively coupled to the inner code encoder, wherein the decoder decodes the code words generated by the inner code encoder.

31. An apparatus for coding and decoding data in a data communication system, wherein the data communication system includes a plurality of customer premise equipment (CPE) in communication with associated and corresponding base stations, and wherein the base stations each include an associated and corresponding media access control (MAC) having a plurality of MAC data messages, and wherein the MAC transports a MAC data message through a MAC data packet that is mapped to at least one TC/PHY packet in a layered data transport architecture, comprising:
   (a) means for generating an outer code for a plurality of data elements of a selected TC/PHY packet using an (N,K) Reed-Solomon (RS) code over $GF(2^m)$, where N is the length of the RS code, K is the message length and m is the length of a symbol;
   (b) means, coupled to the outer code generating means, for generating an inner code using a (m+1, m) parity check code, wherein the inner code comprises a plurality of short length block codes derived from a short constraint length convolutional code using trellis tailbiting; and
   (c) means, coupled to the inner code generating means, for decoding the inner code generated by the inner code generating means.

32. The apparatus as defined in claim 31, wherein the decoding means comprises:
   (1) a maximum likelihood soft decision parity-check code decoding means for decoding the inner code generated by the inner code generating means, and for generating a plurality of decoded bits associated with the plurality of data elements of the selected TC/PHY packet; and
   (2) a Reed-Solomon code decoding means, operatively coupled to the parity-check code decoding means, for decoding the plurality of decoded bits generated by the parity-check code decoding means.

* * * * *